(12) United States Patent
Jan et al.

(10) Patent No.: US 7,396,708 B2
(45) Date of Patent: Jul. 8, 2008

(54) ETCHING METHOD FOR METAL LAYER OF DISPLAY PANEL

(75) Inventors: Shiun-Chang Jan, Hsinchu (TW); Yi Lu, Hsinchu (TW); Yi-Ming Shan, Hsinchu (TW); Yi-Chun Chen, Hsinchu (TW)

(73) Assignee: Au Optronics Corporation, Hsinshu (TW)

( * ) Notice: Subject to any disclaimer, the term of this patent is extended or adjusted under 35 U.S.C. 154(b) by 0 days.

(21) Appl. No.: 11/690,137

(22) Filed: Mar. 23, 2007

(65) Prior Publication Data

US 2008/0121617 A1    May 29, 2008

(30) Foreign Application Priority Data

Nov. 16, 2006    (TW)    .............................. 95142390 A

(51) Int. Cl.
*H01L 21/00*    (2006.01)
*H01L 21/84*    (2006.01)

(52) U.S. Cl. .................. 438/149; 438/151; 438/158; 438/745; 438/754

(58) Field of Classification Search .............. None
See application file for complete search history.

(56) References Cited

U.S. PATENT DOCUMENTS

| | | | | |
|---|---|---|---|---|
| 5,668,650 A | * | 9/1997 | Mori et al. | 349/42 |
| 6,218,821 B1 | | 4/2001 | Bisbee | |
| 6,297,161 B1 | | 10/2001 | Sah | |
| 6,762,802 B2 | * | 7/2004 | Ono et al. | 349/38 |
| 2004/0004220 A1 | | 1/2004 | Suzuki | |
| 2005/0170564 A1 | * | 8/2005 | Lai | 438/149 |
| 2006/0099747 A1 | * | 5/2006 | Park | 438/158 |

FOREIGN PATENT DOCUMENTS

| | | |
|---|---|---|
| TW | 584914 | 4/2004 |
| TW | 586223 | 5/2004 |

* cited by examiner

*Primary Examiner*—Duy-Vu N Deo
(74) *Attorney, Agent, or Firm*—Jianq Chyun IP Office

(57) ABSTRACT

An etching process of a metal layer of a display panel is provided. First, a substrate with at least one display panel region, a testing device region, and a non-device region is provided. Then, a metal layer is formed over the substrate to cover the display panel region, the testing device region, and the non-device region. Next, a mask is formed on the metal layer to expose a portion of the metal layer. The area of the metal layer exposed by the mask substantially occupies 70%~88% of the total area of the metal layer. Thereafter, a wet etching process is performed to remove the metal layer exposed by the mask.

12 Claims, 3 Drawing Sheets

ETCHING METHOD FOR METAL LAYER OF DISPLAY PANEL

CROSS-REFERENCE TO RELATED APPLICATION

This application claims the priority benefit of Taiwan application serial no. 95142390, filed Nov. 16, 2006. All disclosure of the Taiwan application is incorporated herein by reference.

BACKGROUND OF THE INVENTION

1. Field of the Invention

The present invention relates to an etching method, and more particularly to a method for etching a metal layer of a display panel.

2. Description of Related Art

Nowadays, displays have served as major communication interfaces between humans and machines. Thus, users may get information from displays and then control the operation of apparatuses. Particularly, the liquid crystal displays (LCDs) have become mainstream display products. In general, an LCD mainly includes a thin film transistor (TFT) array substrate, a color filter substrate, and a liquid crystal layer sandwiched between the two substrates. Here, each of the TFTs including a gate, a channel layer, a source and a drain is mainly used to control the data input into a pixel of the LCD.

FIG. 1 is a schematic cross-sectional view illustrating one of the TFTs in the conventional TFT array substrate. Referring to FIG. 1, a TFT 110 disposed on a substrate 100 includes a gate 111, a gate insulating layer 112, a channel layer 113, a source 114a, a drain 114b, and a passivation layer 115. In addition, a pixel electrode 120 is electrically connected to the drain 114b through a contact 115a in the passivation layer 115. The method for fabricating said gate 111, said gate insulating layer 112, said channel layer 113, said source 114a, said drain 114b, and said passivation layer 115 mainly includes performing several thin film deposition processes, lithographic processes, and etching processes repeatedly, such that the aforementioned devices are formed on the substrate 100.

The structure of the metal layer of the TFT array substrate poses a significant impact on the electrical performance of the TFTs. If the width of the metal line is poorly formed, it affects the electrical characteristics of the TFT. Not only the performance of the TFT is reduced, but the functions of the TFT array substrate are influenced.

For example, if the line width of the metal lines is not uniform, structural differences among the TFTs then occur. The different electrical characteristics of the TFTs lead to undesirable displaying quality of the display. Moreover, if a chamfer is formed at the metal layer after the etching process, the capability of step coverage of a thin film is then deteriorated in a successive thin film deposition process, thus resulting in defects of the TFTs and failure of the devices. Furthermore, the formation of the chamfer brings about a point discharge effect on the devices, therefore making the TFTs fragile and having a negative influence on the performance and the life span of the displays.

Generally speaking, the etching process performed on the metal layer includes a dry etching process and a wet etching process. With the growing demands for larger-sized TFT panels and substrates, an increase of glass substrates in size results in various issues in the current manufacturing process if the dry etching process is performed to pattern the metal layer of the TFT. For example, it is required to provide a larger vacuum environment when a larger glass substrate is placed into a dry etching chamber to perform the dry etching process. Thereby, the cost of exhausting gases out of the large vacuum environment is certainly increased, and it is rather difficult to maintain uniformity of the etching plasma in the large dry etching chamber, thus bringing about non-uniformity of etching.

To overcome said shortcomings, a method of two-step etching is disclosed in U.S. Pat. No. 6,218,821 to solve the problems arisen from the formation of the chamfer at the metal layer. In the related art, a wet etching process is conducted to etch an upper barrier layer and a main metal layer. Then, a dry etching process is performed to etch a lower barrier layer and a channel layer of a TFT device. However, said method including two-step etching not only requires an increase in the number of machines and in costs of manufacturing the TFTs, but also causes undesired metal patterns, thus resulting in loose control of the quality of the TFTs.

Furthermore, the method for fabricating the TFTs disclosed in US Publication No. US 2004/004220 provides a dry etching method comprising multiple steps by using different gases, so as to prevent the formation of the chamfer at the metal layer. Comparatively speaking, this related art requires neither an increase in the number of machines nor sufficient costs incurred in the manufacturing process. However, in terms of an even larger TFT array substrate, the dry etching method still faces the problems of uniformity of etching and the operating costs.

To resolve the issues arisen from etching the metal layer by using the dry etching process, it is common to conduct the wet etching process to etch the metal layer in the manufacturing process of TFTs. A process of patterning one of the metal layers by wet etching in the conventional TFT manufacturing process is described below for further illustration.

FIGS. 2A to 2B are schematic cross-sectional flow charts illustrating a fabrication process of patterning a metal layer through the wet etching method in a conventional process of manufacturing the TFT array substrate. Referring to FIG. 2A, a gate 111, a gate insulating layer 112, a channel layer 113, a metal layer 114, and an mask 130 are successively formed over the substrate 100. Then, a wet etching process is performed to remove the metal layer 114a uncovered by the mask 130. Then, referring to FIG. 2B, the source 114a and drain 114b are formed after the etching process is performed on the metal layer 114. Finally, the mask 130 is removed.

The disadvantages of the increase in costs and non-uniformity of etching in the dry etching process can be prevented when the wet etching process is applied to the process of manufacturing large-sized panels. However, the wet etching process is an isotropic etching process i.e. it has a greater lateral etching rate, the etching process performed on the metal layer causes the problems of an excessive lateral etching amount, further resulting in the formation of the chamfer at the metal layer 114 as shown in FIG. 2B and in an uneven profile of the metal layer 114.

FIG. 2C is a schematic cross-sectional view illustrating a formation of other film layers on the metal layer with the chamfer. Referring to FIG. 2C, when other film e.g. the passivation layer 115 is continuously deposited on the metal layer 114, the capability of step coverage of the passivation layer 115 is reduced due to the existence of the chamfer. Thus, defects or point discharge effects are likely to occur at the tip 116, further leading to failure of the devices.

Additionally, the chamfer at the metal layer or the uneven profile thereof results in non-uniformity of width of the metal lines in the TFT array substrate. The consequential differences in electrical characteristics of each TFT device then affect the optical characteristics of the display panel using the TFT array substrate and cause mura defect. This significantly reduces the displaying quality of the panel.

It can be deduced that one of the critical factors to evaluate the performance of the LCD is the way to decrease the lateral etching amount of the metal layer during the wet etching process. Thereby, the formation of the chamfer can be prevented after the metal layer is etched and a desirable profile of the metal layer can be further obtained.

In order to etch the metal layer through the wet etching process without forming the chamfer due to the fast lateral etching rate, an annealing process is performed after the formation of the metal layer to form a layer of fine crystal grains thereon, as is provided in Taiwan Patent No. I584914. Since the layer of the fine crystal grains has a faster etching rate than the metal layer does, the formation of the chamfer at the metal layer can be avoided.

On the other hand, a sacrificial layer, with a faster etching rate than the metal layer, is provided in U.S. Pat. No. 6,297,161. The sacrificial layer disposed on the metal layer also prevents the formation of the chamfer. All of the related arts discussed above, however, result in an increase in the manufacturing costs, and the etchant inactivates as used repeatedly. Thus, the lateral etching amount is not under an effective control even though the etchant is replaced by a new one.

According to the aforesaid methods for reducing the formation of the chamfer, the manufacturing costs of the TFT array substrate increase regardless of performing the annealing process to change the characteristics of the upper film on the metal layer, or of forming the sacrificial layer. Moreover, with the change of the characteristics of the upper film or the formation of the sacrificial layer, the characteristics of the TFT devices change. This can be one of the factors affecting the characteristics of the TFT devices, and it is even more unlikely to control the electrical characteristics of the TFT devices and to monitor the yield rate. Thus, a better solution is still required.

One of the most common manufacturing processes utilized in the industry is to increase the thickness of the passivation layer or the insulating layer in accordance with Taiwan Patent No. I586223. Alternatively, a planarization layer is added to reduce the influence on the electrical characteristics of the TFTs due to the formation of the chamfer. Still, the increase in materials and costs during said manufacturing processes does exist and brings about greater height differences of the TFTs. Hence, the subsequent alignment process is affected, and the displaying quality of the displays is further reduced.

In general, when the nitric acid solution reacts with the metal layer e.g. Al layer, two of chemical reactions occur, $$Al+HNO_3 \rightarrow Al_2O_3+H_2O+NO_2 \quad \text{(reaction 1)}$$

$$Al+HNO_2 \rightarrow Al_2O_3+H_2O+NO_2 \quad \text{(reaction 2)}$$

Here, the nitride dioxide ($NO_2$) produced in reaction 1 reacts with water and produces nitrous acid ($HNO_2$). $HNO_2$ oxidizes the Al metal and produces aluminum oxide ($Al_2O_3$), and the valence of the nitrogen atoms in $HNO_2$ is +3, which is relatively unstable to a +5 valence of the nitrogen atoms in the nitric acid. Therefore, reaction 2 has a reaction rate higher than that of reaction 1, such that reaction 1 is the rate determining step (RDS) when the Al metal reacts with the nitric acid solution.

It should be understood that the etchant used in the conventional etching process is, as a rule, the nitric acid solution, and the concentration thereof usually is in a range from 0.2% to 6.0%. The concentration is raised to 1.5%~10% when the etchant is replaced, and reaction 2 is then induced. Thereby, the lateral etching rate of the Al metal is increased to a range between 100 Å/sec and 180 Å/sec, and the ratio of the maximum lateral etching amount to the minimum etching amount is about 0.85~1.0. Thus, the occurrence of reaction 2 and the corresponding reaction with the Al metal are the key factors of the formation of the chamfer at the Al metal layer and non-uniformity of lateral etching.

Another well-known manufacturing process to reduce the formation of the chamfer at the metal layer is performed by adjusting a recipe of the etching solution e.g. by changing the ratio of composition of the nitric acid or by adding a surfactant to decrease the etching reaction rate. Thereby, the lateral etching amount can be controlled to reduce the formation of the chamfer. However, given that the chemical concentration of the etchant is decreased, the etching process using said etchant cannot be frequently and constantly performed. In other words, the performance of the etchant is significantly reduced after the etching process is performed on few substrates, such that the replacement frequency of the etchant is high and the manufacturing cost is increased.

SUMMARY OF THE INVENTION

The present invention relates to a method for etching a metal layer of a display panel, so as to solve the problem of an excessive etching amount arisen from a lateral etching process when a wet etching is performed to etch the metal layer.

The present invention further relates to a method for etching the metal layer of the display panel. The method includes providing a substrate comprising at least one display panel region, a testing device region, and a non-device region. Then, the metal layer is formed over the substrate to cover said display panel region, said testing device region, and said non-device region. Next, a mask is formed on the metal layer to expose a portion of the metal layer. The area of the metal layer exposed by the mask substantially occupies 70%~88% of the total area of the metal layer. Thereafter, a wet etching process is performed to remove the metal layer exposed by the mask.

According to one embodiment of the present invention, said metal layer includes aluminum (Al), molybdenum (Mo), chromium (Cr), the alloys thereof or the nitrides thereof.

According to one embodiment of the present invention, the metal layer has a multi-layer structure comprised of Al, Mo, Cr, aluminum nitride, molybdenum nitride, chromium nitride, Al alloy, Mo alloy, Cr alloy, or any combinations thereof.

According to one embodiment of the present invention, the mask is made of a photoresist material.

According to one embodiment of the present invention, the area of the metal layer exposed by the mask preferably occupies 80%~88% of the total area of the metal layer.

According to one embodiment of the present invention, nitric acid solution is used as an etchant in the wet etching process.

According to one embodiment of the present invention, a lateral etching rate in the wet etching process is substantially in a range from 20 to 160 angstroms per second, preferably from 30 to 130 angstroms per second.

According to one embodiment of the present invention, a ratio of a maximum lateral etching amount to a minimum etching amount in the wet etching process is substantially in a range from 0.4 to 0.95, preferably from 0.5 to 0.9.

According to one embodiment of the present invention, an oblique angle of the metal layer is less than 90 degrees, preferably in a range from 40 to 85 degrees.

The present invention divides the TFT array substrate into three areas, including at least one display panel region, a testing device region, and a non-device region, within which the ratio of the area of the Al metal layer uncovered by the mask is adjusted, such that the total exposed area of the Al metal layer is in a range from 70% to 88%. In the present invention, nitric acid solution is used as an etchant for the Al metal layer, so that a by-product $HNO_2$ having high reaction rate is produced to react with the Al metal. During the wet etching, a number of Al ions are generated by adjusted the total exposed area of the Al metal layer to a range between 70% and 88%, and the reaction of the nitric acid rapidly reaches a saturation state. Then, the etching process can be performed on the metal layer through the reaction of $HNO_2$ having lower reaction rate. Thereby, the lateral etching rate is reduced by 10%~90%, thus restraining the formation of the chamfer arisen from the excessive etching amount produced by a lateral etching process in the related art.

In order to the make the aforementioned and other objects, features and advantages of the present invention comprehensible, a embodiment accompanied with figures are described in detail below.

DESCRIPTION OF EMBODIMENTS

The present invention adjusts the ratio of the area of the Al metal layer uncovered by the mask, such that the total exposed area of the Al metal layer ranges from 70% to 88%, and the contact area between the Al metal layer and the nitric acid solution is increased. When the Al metal is in contact with the nitric acid solution, reaction 1 is initiated. Here, a number of Al ions and $NO_2$ are generated in the etching solution. $NO_2$ reacts with water and produces $HNO_2$. Once $HNO_2$ is produced, reaction 2 in which $HNO_2$ reacts with a part of the Al ions is soon initiated, such that reaction 2 rapidly reaches a saturation state. Here, since a greater area of the Al metal is exposed according to the present invention, the lateral etching performed on the Al metal layer is not apparent when reaction 2 reaches the saturation state. Reaction 1 then becomes the main reaction between the nitric acid solution and the Al metal, and then reaction 1 controls the etching profile of the Al metal.

For the foregoing reasons, reaction 2 with high reaction rate is effectively controlled during the etching process in the present invention. Thereby, both the lateral etching rate and the ratio of the maximum lateral etching amount to the minimum etching amount are obviously reduced. In consequence, the present invention effectively prevents the formation of the chamfer and non-uniformity of etching when the metal layer is etched.

The following embodiments are exemplified to describe the etching process performed on the Al metal with use of the nitric acid solution as the etchant. The metal layer to be etched comprises Al, Mo, Cr, nitride made up by said metals, or an alloy made up by the same. Furthermore, the metal layer can be a stacked structure comprises Al, Mo, Cr, nitride made up by said metals, or an alloy made up by the same. The material and the structure of the metal layer are not limited in the present invention.

Several embodiments are provided below to well describe the technical features of the present invention.

First Embodiment

Figure 1:
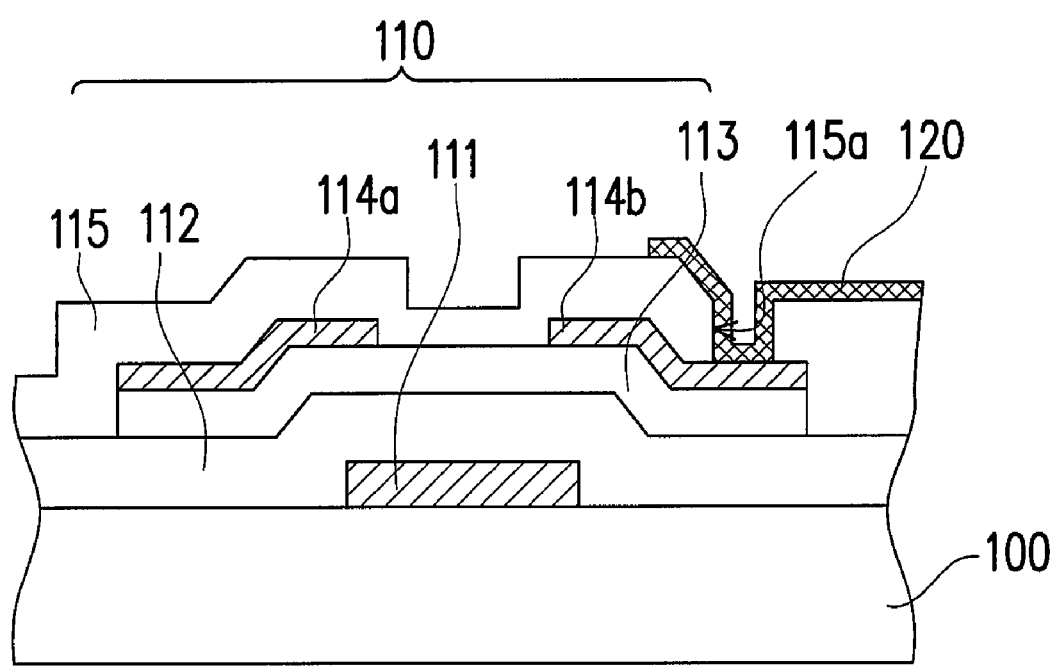
FIG. 1 is a structural cross-sectional view illustrating a TFT of a conventional display panel.
Figure 2A:
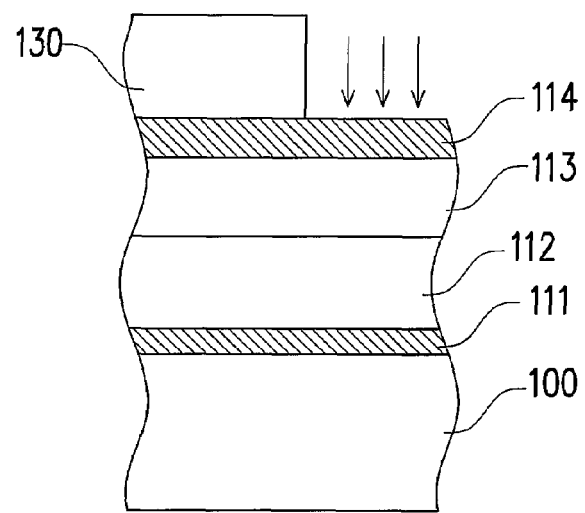
FIGS. 2A to 2B are schematic cross-sectional flow charts illustrating a fabrication process of patterning a metal layer through the wet etching method in a conventional process of manufacturing the TFT array substrate.
Figure 2B:
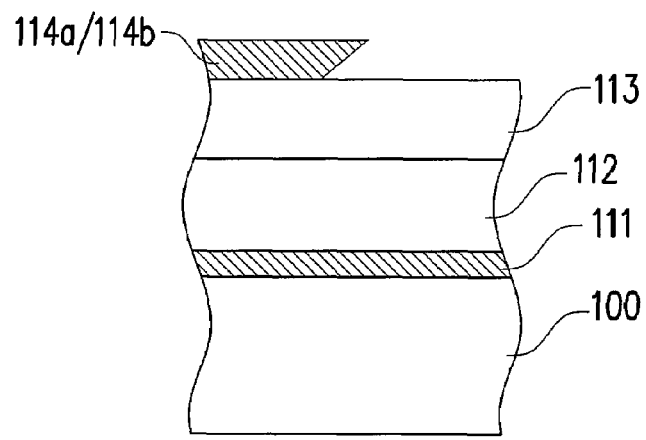
Figure 2C:
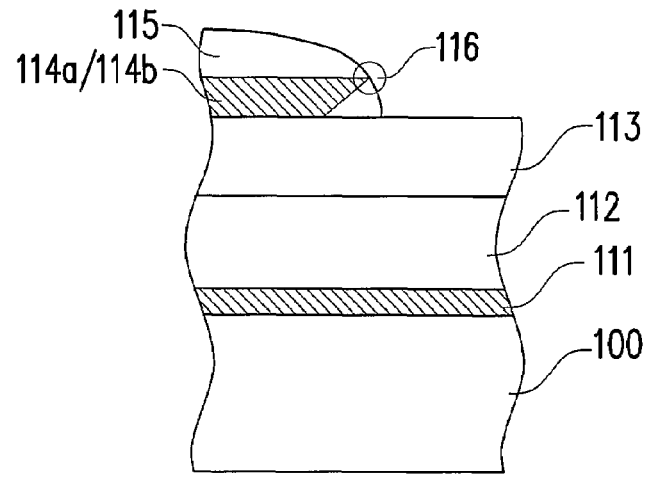
FIG. 2C is a cross-sectional view illustrating a formation of other film layers on the metal layer incorporating the chamfer.
Figure 3A:
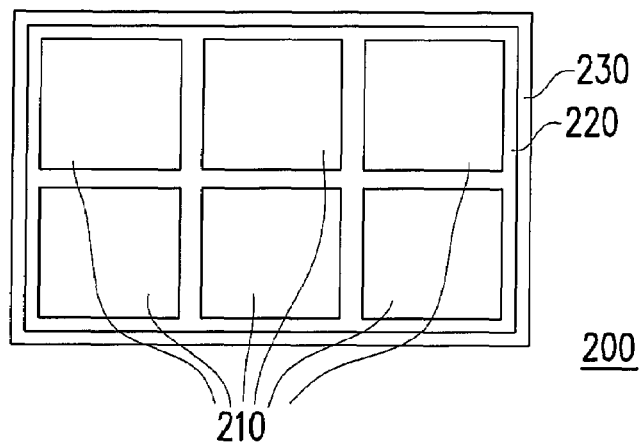
FIGS. 3A to 3C are top views illustrating a process of etching the metal layer of the display panel according to an embodiment of the present invention.
Figure 3B:
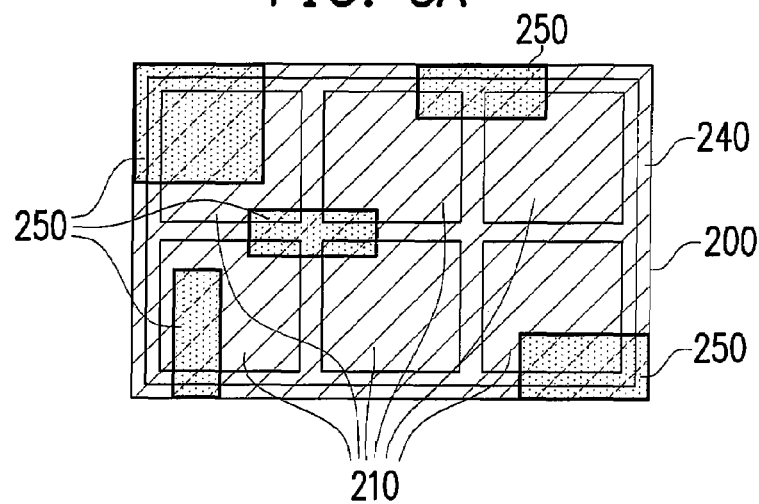
Figure 3C:
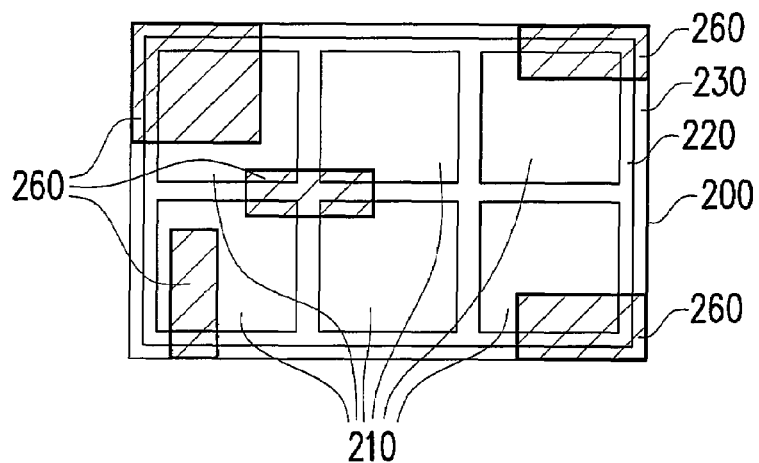

FIGS. 3A to 3C are top views illustrating a process of etching the metal layer of the display panel according to an embodiment of the present invention. Referring to FIG. 3A, a substrate 200 is provided. The substrate 200 is divided into several display panel regions 210, a testing device region 220, and a non-device region 230.

According to the present embodiment, several display panel regions 210 occupy 81% of the area of the substrate 200, the testing device region 220 occupies 12%, and the non-device region 230 occupies 7% based on the total area of the substrate 200. The ratio indicated in FIG. 3A is not in exact proportion to the substrate 200 but merely represents relative positions of the respective regions.

According to the present embodiment, the display panel regions 210 amount to six, while the number of the display panel regions 210 is not limited in the other embodiments and is determined upon the design of the panel. Moreover, the display panel regions 210 of the present embodiment are arranged in array, while said regions are arranged in an interleaved way according to the other embodiments. Furthermore, the ratios of the area of the display panel regions 210, the testing device region 220, and the non-device region 230 to the area of the substrate 200 are not limited in the other embodiments and are determined upon the design of the panel as well.

Referring to FIG. 3B, a metal layer 240 is formed over the substrate 200. Then, a mask 250 is formed on the metal layer 240. It should be noted that the mask 250 illustrated in FIG. 3B is not an actual pattern but a presentation. In addition, according to the embodiment, the material of the metal layer 240 is Al, while the mask 250 is made up by a photoresist material.

Note that the covered area of the metal layer 240 approximately occupies 24% of the total area of the metal layer 240 after changing the design of the mask 250 according to the present embodiment. Namely, the coverage ratio is 24%. In other words, the exposed area of the metal layer 240 accounts for 76% of the total area of the metal layer 240 i.e. the exposure ratio is 76%. According to the related art, the most common exposure ratio is 67%. According to the present embodiment, the exposure ratio of the metal layer 240 is increased to 76% through modifying the mask 250.

Each of the regions disclosed in the present embodiment has different exposure ratios. The exposure ratio of the display panel regions 210 is 80%, that of the testing device region 220 is 60%, and that of the non-device region 230 is 60%. Upon the calculation of the ratio of the area occupied by each of the regions to the total area of the substrate 200 and the exposure ratio of each of the regions, the total exposure ratio is (81%×80%)+(12%×60%)+(7%×60%)=76% in the present embodiment.

Next, referring to FIG. 3C, a wet etching process is performed to remove the metal layer 240 exposed by the mask 250. Thereafter, the mask 250 is removed to form a patterned metal layer 260.

In the present embodiment, the contact area between the Al metal and the nitric acid solution is increased due to the higher exposure ratio of the metal layer 240. When the Al metal is in contact with the nitric acid solution, reaction 1 is initiated. Here, a large number of Al ions and $NO_2$ are generated in the etching solution. $NO_2$ reacts with water and produces $HNO_2$. Once $HNO_2$ is produced, reaction 2 in which $HNO_2$ reacts with a part of the Al ions is soon initiated, such that reaction 2 rapidly reaches the saturation state. Here, since a greater area of the Al metal is exposed according to the present embodiment, the lateral etching performed on the Al metal layer is not apparent when reaction 2 reaches the saturation state. Reaction 1 then becomes the main reaction between the nitric acid solution and the Al metal. Reaction 1 having lower reaction rate controls the etching profile of the Al metal.

In view of the foregoing, reaction 2 having higher reaction rate is effectively controlled during the etching process in the present embodiment. Thereby, the lateral etching rate is reduced by 10%~30%, and the ratio of the maximum lateral etching amount to the minimum etching amount is decreased to a range between 0.75 and 0.9. In consequence, the formation of the chamfer and non-uniformity of etching when the metal layer is etched can be avoided by adjusting the ratio of the area of the Al metal layer uncovered by the mask.

Second Embodiment

The display panels disclosed in the present embodiment are similar to those in the aforesaid embodiment by reference of FIG. 3. No further description will be provided hereinafter. The most significant difference between said embodiment and the present embodiment lies in that the design of the mask 250 is changed, so that the total exposed area of the metal layer 240 is further increased. As is listed below, a greater area of the Al metal is exposed when the total exposure ratio disclosed in the present embodiment is adjusted up to (81%× 80%)+(12%×80%)+(7%×80%)=80%. Next, the etching process is performed to lower the lateral etching rate of the Al metal by 25%~60%, and the ratio of the maximum lateral etching amount to the minimum etching amount is further decreased to the range from 0.5 to 0.75. At said exposure ratio, the influence of the formation of the chamfer or non-uniformity of lateral etching can be minimized, and the profile of the metal layer 240 is greatly improved.

After the etching process is performed on the metal layer, it is of certainty that following processes including forming a passivation layer, a planarization layer, and a pixel electrode are then carried out in the pixel array substrate of the present embodiment, so that the fabrication of the TFT array substrate is completed.

The method for etching the metal layer of the display panel according to the present invention does not limit the size of the display panel. Accordingly, said method can also be applied to the metal etching process of the large-sized substrate.

Still, the embodiment is described by reference of FIG. 3. In general, the substrate 200 of the large-sized panel can be divided into three areas were provided as above. Particularly speaking, in order to effectively maintain uniformity of the electrical characteristics of the TFTs in the large-sized substrate, the line width of the metal layer 240 is usually broadened, and the metal layer 240 is also thickened. Thereby, the total exposure ratio of the large-sized panel is lower than that of the small-sized panel, and the excessively high lateral etching rate brings about poor uniformity of the profile of the metal layer 240.

In the conventional large-sized panel, the total exposure ratio thereof merely reaches 58%, the lateral etching rate approaches 100 Å/sec~180 Å/sec, and the ratio of the maximum lateral etching amount to the minimum etching amount approximately ranges from 0.85 to 1.0. The etching process performed on the metal layer 240 exercises a dominant and damaging influence on the formation of the chamfer arisen from the excessive etching amount.

Third Embodiment

According to the present embodiment, the total exposure ratio of the metal layer 240 of the large-sized panel is increased to 72% when the same design of the mask 250 is utilized. Similar to the aforesaid embodiments, the present embodiment effectively decreases the lateral etching rate by 10%~30%, and the ratio of the maximum lateral etching amount to the minimum etching amount is reduced to 0.75~0.9. Thereby, the profile of the metal layer 240 can be greatly improved as well.

Fourth Embodiment

As stated above, given that the total exposure ratio of the metal layer 240 of the large-sized panel is increased to 81%, the lateral etching rate is further decreased by 25%~60%, and the ratio of the maximum lateral etching amount to the minimum etching amount is then reduced to 0.5~0.8. Thereby, the chamfer at the metal layer 240 is barely formed, and the profile of the metal layer on which the lateral etching process is performed is almost uniform.

The method for etching the display panel provided in the present prevention can be applied not only to the process of manufacturing the source and drain but also to the process of etching a gate electrode. The most significant difference between said embodiments and the present embodiment lies in that the oblique angle at the cross-section of the gate metal must be accurately regulated, so as to prevent the destruction of the devices or defects on electrical characteristics.

Fifth Embodiment

This embodiment is described still by reference of FIG. 3. The exposure ratio of the metal layer 240 is improved in the present embodiment through modifying the mask 250. The area of the gate is less than those of the source and drain, and the area covered by photoresist in the gate is also smaller than that in the source and drain. Hence, the total exposure ratio easily exceeds 70%. The total exposure ratio provided in the present embodiment is 75%. Likewise, the lateral etching rate is decreased by 10%~30%, and the ratio of the maximum lateral etching amount to the minimum etching amount is correspondingly reduced to 0.75~0.9.

Sixth Embodiment

Given that the total exposure ratio of the metal layer 240 of the display panel is increased to 84%, the lateral etching rate is further decreased by 25%~65%, and the ratio of the maximum lateral etching amount to the minimum etching amount is correspondingly reduced to 0.65~0.8. Thereby, the etching profile of the metal layer on the panel can be controlled to obtain a gate metal layer with restrained formation of the chamfer and better uniformity of lateral etching.

Seventh Embodiment

According to the present embodiment, the total exposure ratio of the metal layer 240 of the display panel can be further increased to 88%. Meanwhile, the lateral etching rate is significantly decreased by 40%~90%, and the ratio of the maximum lateral etching amount to the minimum etching amount is correspondingly reduced to 0.2~0.7. It should be noted that the oblique angle of the metal layer 240 is less than 60 degrees, and the etching time increases as more response time is required.

From the experimental results indicated above, the method of etching the metal layer of the display panel disclosed in the present invention has a lateral etching rate at a range from 20 to 160 angstroms per second, preferably from 30 to 130 angstroms per second. The ratio of the maximum lateral etching amount to the minimum etching amount ranges from 0.4 to 0.95, preferably from 0.5 to 0.9. In addition, the oblique angle of the metal layer is less than 90 degrees, preferably ranging from 40 to 85 degrees.

In summary, the method for etching the metal layer of the display panel disclosed in the present invention increases the ratio of the area of the Al metal layer exposed by the mask. In other words, the total exposure ratio of the Al metal layer attains to 70%~88%, and the number of the Al ions increases during the etching process. Accordingly, during the reaction between the Al metal and the nitric acid solution, the sufficient number of the Al ions allows the $HNO_2$ to reach the saturation state rapidly and restrains the lateral etching. The reaction initiated by the nitric acid solution which needs more reaction time to react with the Al metal then becomes the main reaction of the metal etching. Thereby, the lateral etching rate is reduced by 10%~90%, and a good control on the profile of the metal layer can be achieved.

Furthermore, according to the present invention, an inverse proportion relationship is existed between the total exposure ratio of the metal layer and the oblique angle thereat. Namely, the higher the total exposure ratio of the metal layer is, the smaller the oblique angle at the metal layer is. Thereby, the oblique angle can be adjusted. On the other hand, a direct proportion relationship is existed between the total exposure ratio of the metal layer and the etching profile thereof according to the present invention. Thus, the profile of the metal layer can be further improved through changing the total exposure ratio of the metal layer.

Moreover, the method for etching the metal layer provided in the present invention can be applied to the etching process of not only the source and drain but also the gate. In addition to that, extra manufacturing processes, machines, or materials are not required for the etching method provided by the present invention, and the profile of the metal layer can be significantly improved by a slight change in the design of the mask.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method for etching a metal layer of a display panel, the method comprising:
   providing a substrate, wherein the substrate comprises at least one display panel region, a testing device region, and a non-device region;
   forming a metal layer over the substrate to cover the display panel region, the testing device region, and the non-device region;
   forming a mask on the metal layer to expose a portion of the metal layer, wherein the area of the metal layer exposed by the mask substantially occupies 70%~88% of the total area of the metal layer; and
   performing a wet etching process to remove the metal layer exposed by the mask.

2. The method of claim 1, wherein the metal layer comprises Al, Mo, Cr, the alloys thereof or the nitrides thereof.

3. The method of claim 1, wherein the metal layer comprises a multi-layer structure comprised of Al, Mo, Cr, Al alloy, Mo alloy, Cr alloy, aluminum nitride, molybdenum nitride, chromium nitride, or any combinations thereof.

4. The method of claim 1, wherein the mask is made of a photoresist material.

5. The method of claim 1, wherein the area of the metal layer exposed by the mask occupies 80%~88% of the total area of the metal layer.

6. The method of claim 1, wherein nitric acid is used as an etchant in the wet etching process.

7. The method of claim 1, wherein a lateral etching rate in the wet etching process is substantially in a range from 20 to 160 angstroms per second.

8. The method of claim 7, wherein the lateral etching rate in the wet etching process is in a range from 30 to 130 angstroms per second.

9. The method of claim 1, wherein a ratio of a maximum lateral etching amount to a minimum etching amount in the wet etching process is substantially in a range from 0.4 to 0.95.

10. The method of claim 9, wherein the ratio of the maximum lateral etching amount to the minimum etching amount in the wet etching process is in a range from 0.5 to 0.9.

11. The method of claim 1, wherein an oblique angle of the metal layer is less than 90 degrees.

12. The method of claim 11, wherein the oblique angle of the metal layer is from 40 to 85 degrees.

* * * * *